United States Patent [19]
Dehaine et al.

[11] Patent Number: 5,901,039
[45] Date of Patent: *May 4, 1999

[54] MOUNTING DEVICE FOR ELECTRONIC COMPONENTS

[75] Inventors: Gérard Dehaine, Châtillon; Yves Stricot, Les Clayes sous Bois, both of France

[73] Assignee: Bull S.A., Louveciennes, France

[*] Notice: This patent issued on a continued prosecution application filed under 37 CFR 1.53(d), and is subject to the twenty year patent term provisions of 35 U.S.C. 154(a)(2).

[21] Appl. No.: 08/895,475

[22] Filed: Jul. 16, 1997

Related U.S. Application Data

[63] Continuation of application No. 08/579,270, Dec. 27, 1995, abandoned.

[51] Int. Cl.$^6$ ........................................... H05K 7/20
[52] U.S. Cl. ..................... 361/704; 257/719; 361/719
[58] Field of Search ..................... 165/80.3, 185; 257/706, 707, 713, 718, 719, 727; 174/52.4, 16.3, 252, 254, 260; 439/66, 71, 74, 86, 90, 91, 485, 526, 591; 361/690, 702–705, 717–719, 735, 741, 752, 756, 760, 764, 767, 768, 784, 785, 789, 790

[56] References Cited

U.S. PATENT DOCUMENTS

| | | |
|---|---|---|
| 4,224,663 | 9/1980 | Maiese ..................................... 363/144 |
| 4,342,068 | 7/1982 | Kling . |
| 4,758,927 | 7/1988 | Berg ......................................... 361/761 |
| 4,914,551 | 4/1990 | Anschel .................................. 361/389 |
| 5,065,282 | 11/1991 | Polonio .................................... 361/752 |
| 5,109,317 | 4/1992 | Miyamoto et al. . |
| 5,123,849 | 6/1992 | Deak .......................................... 439/66 |
| 5,262,925 | 11/1993 | Matta ....................................... 361/783 |
| 5,305,185 | 4/1994 | Samorov ................................. 361/704 |
| 5,473,510 | 12/1995 | Dozier, II ............................... 361/719 |

FOREIGN PATENT DOCUMENTS

| | | |
|---|---|---|
| 0236065 | 9/1987 | European Pat. Off. . |
| 0508179 | 10/1992 | European Pat. Off. . |
| 2841370 | 3/1980 | Germany . |

*Primary Examiner*—Gerald Tolin
*Attorney, Agent, or Firm*—Kerkam, Stowell, Kondracki & Clarke, P.C.; Edward J. Kondracki; John C. Kerins

[57] ABSTRACT

A device for mounting a first element onto a second element to sandwich an electrical or electronic component therebetween, wherein the device is operable to cause the first element to exert a contact force on the component when the first element is mounted onto the second element and to couple the device to the first element in a manner which exerts a mounting force on the first element which is independent of whether the first element is mounted onto the second element. The first element may be a heat sink and the second element may be a printed circuit board.

8 Claims, 2 Drawing Sheets

MOUNTING DEVICE FOR ELECTRONIC COMPONENTS

This is a continuation of application Ser. No. 08/579,270, filed Dec. 27, 1995 now abandoned.

TECHNICAL FIELD OF THE INVENTION

The subject of the invention is a process and a device for mounting two elements which sandwich an electrical or electronic component between them in such a way as to exert a contact force on the component. The contact can be thermal and can relate to the devices for carrying off the heat dissipated by the component, which are known as heat sinks. More specifically, the invention relates to the devices for mounting a heat sink onto a wiring board of this component. The invention will be clearly set forth in the remaining text, which refers by way of an illustrated example to the devices for mounting a heat sink with fins onto a printed circuit board. In this context, two corollary objects of the invention are a heat sink and a wiring board. However, the contact can also be electrical, with one of the elements serving, for example, as a voltage supply electrode for the component.

BRIEF DESCRIPTION OF THE PRIOR ART

Numerous devices for mounting heat sinks onto a printed circuit board are already known. They can be classified into various types according to their adaptation to various requirements. The invention relates to the type of mounting device which must be adapted to a simple, effective, reliable and removable mounting which is inexpensive. The criteria for effectiveness relate primarily to the contact force exerted on the component between the heat sink and the board. Preferably, it is desirable in numerous cases for the contact force to be readily adjustable to a desired value which is more or less constant. In some cases, it is also advantageous for the adjustment of the contact force to be adaptable to various types of components distinguished for example, by their thickness. It can also be desirable for the contact force to be less sensitive to unevenness on the surface of the radiator and/or the board and/or the component. It may also be necessary for the contact force to be independent of the thickness of the component within predetermined or deducible limits. Another important factor which may also be required relates to the independence of the desired contact force of the heat sink on the component from the desired mounting force of the mounting device on the board. Another factor which may come into play relates to the mounting's degree of sensitivity to the vibrations of the board. In certain cases, it is also necessary for the mounting device to be adapted to the connection mode of the component. For example, if the component is an integrated circuit connected to the board by means of conductive wires or leads, the device for mounting the heat sink must not modify or affect this connection. Another important characteristic relates to the accessibility of the mounting device on the heat sink or on the board. It is actually desirable for all the elements of the mounting device to be disposed on the heat sink and/or on the board. This facilitates the handling and control of the mounting. But the presence of these elements must not be able to interfere with the presence of the component or its mounting on the board. Preferably, the mounting device will also be suitable for heat sinks with large surface areas, such as heat sinks for integrated circuit packages with high heat dissipation. None of the known heat sinks of this type completely satisfies all these conditions.

SUMMARY OF THE INVENTION

The invention enables the preceding requirements to be completely or partially met in a simple, effective and reliable and inexpensive manner, and more generally, the invention involves two elements, at least one of which exerts a thermal and/or electrical contact force on an electrical or electronic component.

The subject of the invention is a process for mounting two elements which sandwich an electrical or electronic component by means of a mounting device which exerts a contact force on the component, characterized in that on the first of the two elements the mounting device exerts a force which is independent of the mounting of the two elements and has a relationship to this contact force.

According to another characteristic, the mounting device can exert this contact force substantially independently from the mounting force of the mounting device on the second element.

It follows that another subject of the invention is the mounting device which directly results from this process. More specifically, another object of the invention is to provide a device for mounting two elements which sandwich an electrical or electronic component and which exert a contact force on the component, characterized in that the mounting device has means for coupling with the first of these two elements so as to exert on it a force which is independent of the mounting of the two elements and has a relationship to this contact force.

More particularly, a corollary object of the invention is a heat sink for cooling an electrical or electronic component, characterized in that the heat sink constitutes the first element equipped with the mounting device defined previously.

Even more particularly, a corollary object of the invention is a board for connecting at least one electrical or electronic component, characterized in that the load constitutes the first element equipped with the mounting device defined previously.

BRIEF DESCRIPTION OF THE DRAWINGS

Other characteristics and advantages of the invention are revealed in the description which follows, given by way of example and made in reference to the appended drawings. In these drawings.

DETAILED DESCRIPTION OF THE PREFERRED EMBODIMENTS

Figure 1:
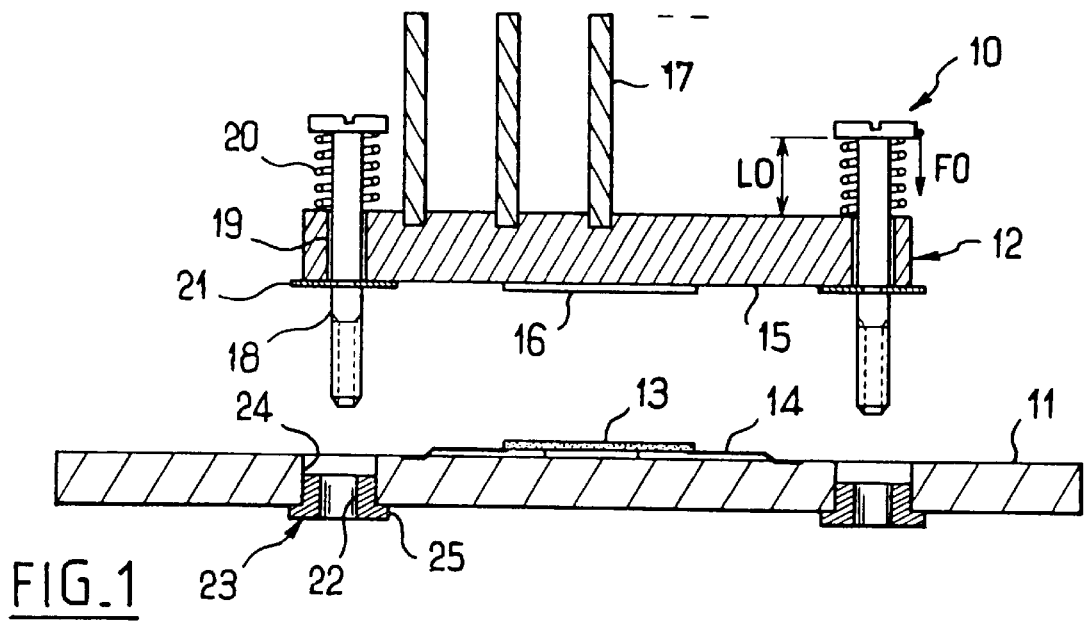
FIG. 1 is a schematic cutaway view of a device according to the invention for mounting a heat sink to a wiring board equipped with an integrated circuit to be cooled, which illustrates the heat sink separately from the board, in position for its subsequent mounting on the board.

FIGS. 1 represents a mounting device 10 between a printed circuit board 11 and a heat sink 12 for cooling a component 13 which is intended to be mounted on the board 11. It is assumed that the component 13 is already mounted on the board 11 and that this component is an integrated circuit equipped with leads 14 whose ends are connected to the board. The active surface which carries the interconnection circuit of the integrated circuit 13 is placed face-to-face with the corresponding surface of the board 11. The heat sink 12 is adapted to come in contact with the opposite, non-active surface of the integrated circuit 13, either directly or through a well known thermal interface. It will be assumed that the contact is made through an interface (not represented) in the form of a layer which requires a predetermined contact force Fc in order to obtain a predetermined thermal resistance. The heat sink 12 illustrated is in the form of a metal plaque 15 for example made of aluminum and having a square profile, whose surface facing the integrated circuit 13 is equipped with a sole 16 which is slightly raised and is adapted to forming good thermal contact with the corresponding surface of the integrated circuit. The opposite surface of the heat sink 12 is equipped with fins 17 which are embedded perpendicularly in the plate 15.

The mounting device 10 illustrated includes four screws 18 which pass through the plate 15 in holes 19 disposed at the four corners of the plate. The head of each screw 18 is placed on the same side as the fins 17 and has a profile which is larger than the adjacent body so as to form a flange. The mounting device 10 also includes four helical springs 20. Each helical spring 20 is positioned coaxial to the screw, with its two ends resting respectively on the plate 15 and on the flange of the screw head 18. On the other side of the plate 15, each screw 18 is equipped with means for coupling with the heat sink which in the example illustrated are in the form of a stop 21 constituted by the clip illustrated which is engaged in a groove in the body of the screw at a predetermined distance from the screw head and is identical for each screw. This distance corresponds to the length L0 of each spring 20 between the screw head and the plate 15. The body of each screw 18 ends in a threaded part disposed beneath the clip 21. The board 11 is provided with holes 22 for receiving the threaded ends of the corresponding screws 18. The placement of the holes 22 on the board determines the position of the heat sink relative to the integrated circuit 13. Each hole 22 is threaded and in the example illustrated, constitutes the inside hole of a nut 23 set inside a hole 24 in the board 11. Each nut 23 has an end which forms a flange serving as a stop against the opposite side of the board.

Figure 2A:
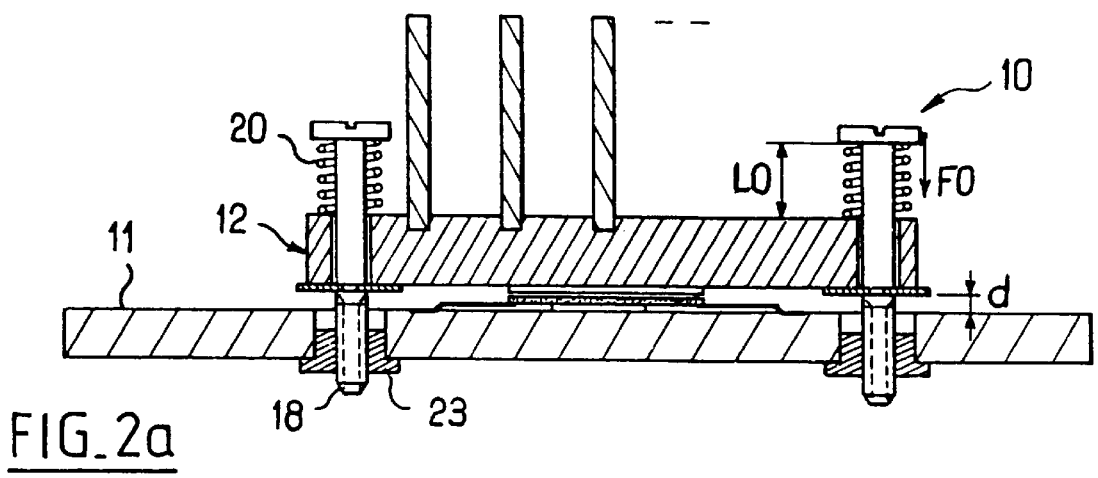
FIGS. 2a and 2b are views similar to those in FIG. 1, which illustrate two principal stages in the mounting process according to the invention.
Figure 2B:
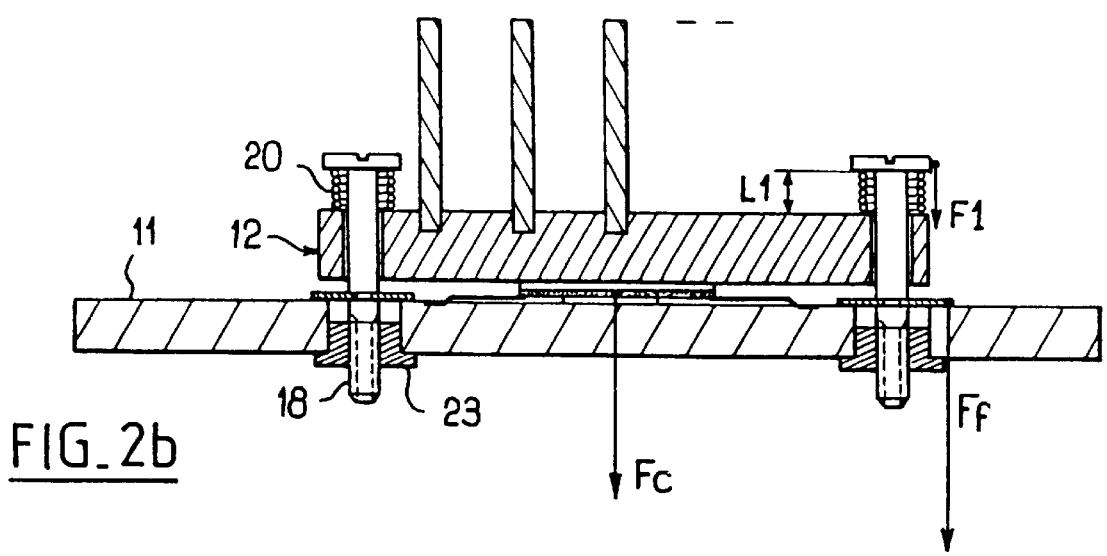

In FIG. 1, the heat sink 12 is shown outside the board 11, for example, in the state in which the heat sink has been purchased. In this state, the springs 20 are compressed so that the sum of the forces F0 it exerts between the heads of the screws 18 and the heat sink 12 roughly corresponds to the predetermined contact force Fc of the heat sink 12 on the integrated circuit 13. The force F0 is therefore applied uniformly at any desired value before being mounted on the board. In FIG. 1, the screws 18 of the heat sink are also illustrated in correspondence with the holes 22 in the board 11. Therefore, in order to begin mounting the heat sink on the board, it is merely necessary to bring the heat sink 12 to the board 11. FIGS. 2a and 2b illustrate stages in the process for mounting the heat sink 12 onto the board 11. FIG. 2a represents an intermediate position of the mounting, in which the screws have been screwed into the holes 22 so as to place the sole 16 of the heat sink 12 in contact with the non-active surface of the integrated circuit 13. Up to this point, the clips 21 remain in contact with the heat sink. As the screwing continues, the force exerted by the springs 18 is transmitted to the integrated circuit 13, and the clips 21 begin to separate from the board 15. FIG. 2b illustrates the position in which the clips 21 come to a stop against the board 11. From this point forwards the screws 18 can be tightened until the desired mounting force Ff is obtained.

Figure 3:
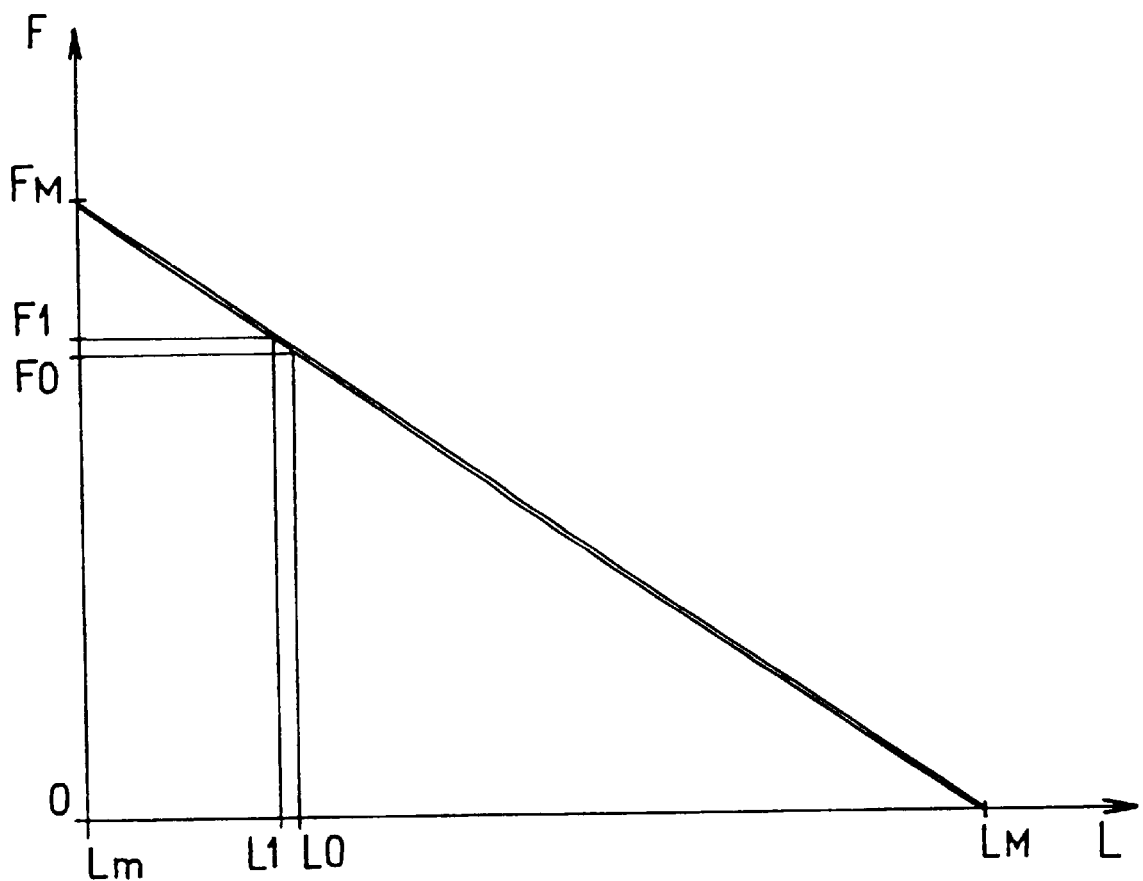
FIG. 3 is a graph which represents variations in the force exerted by each spring used in the mounting device represented in FIGS. 1, 2a and 2b as a function of its elongation, and which illustrates a method for adjusting the force exerted on the heat sink by these springs.

FIG. 3 is a graph which illustrates the variations in the force F exerted by each spring 20 as a function of the length L of the spring between its two ends. It is assumed that the force F varies linearly in inverse proportion to its length, from its maximum length LM in the non-compressed state (F=0) to its minimum length Lm when it is completely compressed and exerting the maximum force FM. The length L0 of each spring 20 is indicated in FIG. 1 and retained in FIG. 2a. Each spring 20 at the length LO exerts the force F0. The tightening of each screw 18 from the intermediate position in FIG. 2a to the final position in FIG. 2b occurs along a length d which compresses the spring 20 by this length, so that its final length in the position illustrated in FIG. 2b is L1=L0-d and it exerts the final force F1. In the final position, the contact force Fc of the heat sink on the integrated circuit is equal to the sum of he four forces F1 exerted by the four springs 20.

There are several possible instances If, as in the example represented by the graph in FIG. 3e the initial compression LM -L0 for bringing the spring 20 from its non-compressed position to the compressed position indicated in FIG. I is substantially greater than the distance d (LH-L0>>d), then the variation d may be considered to be a small or negligible variation from the force F0. Under these conditions, the final force F1, which corresponds to one fourth of the predetermined contact force, may be considered to be roughly equal to the force F0. It may therefore be said that initially, when the heat sink is not mounted on the board as indicated in FIG. 1, the set of springs exerts a force 4F0 which is roughly equal to the predetermined contact force Fc.

According to another example which is not illustrated, the heat sink 12 is provided for the type of component 13 having a non-negligible thickness which is predetermined or which varies slightly from this thickness. For example, the component 13 can be an integrated circuit package of a given type. In this case, it is known that each spring will have a final length of roughly L1=L0-W. Consequently, the springs 20 will initially be compressed to the length L0=L1+W. In this case, the total force exerted by the mounting device 10 on the heat sink 12 regardless of whether it is mounted on the board 11 can be different from the predetermined force Fc by a predetermined value, which here corresponds to the thickness W. This thickness may of course include other thicknesses than that of the component itself. It may therefore be said that the mounting device 10 generally exerts a force on the heat sink 12 which is independent of the mounting of the heat sink on the board 11 and which has a relationship to the contact force.

The fact that in the example illustrated the force F0 is predetermined is one particular instance. According to another example which may be the same as that illustrated, the predetermined contact force Fc can be the minimum force required to obtain a minimum thermal resistance. In this case, the obtainment of any force F1 greater than F0 is advantageous, since it will reduce the thermal resistance and improve the thermal exchange. In some cases, the minimum force required can be very low and imprecise, so that one skilled in the art has quite a large range of values at his disposal, and the contact force may be considered to be any force, or any force within a very large range of possible values.

On the other hand, the preceding description makes it very clear that the mounting according to the process and the device 10 of the invention is perfectly symmetrical. The screws 18, the springs 20 and the stops 21 could also be mounted on the board 11 at the level of the holes 22 on the side opposite that which faces the heat sink 12. The screws 18 would then be set, for example in the holes 19 of the heat sink, or by any other means. This makes it obvious that the mounting device 10 could generally include fastening means 18 other than the screws illustrated, which could be, for example, posts rotated into clamps, or even flanges. The springs 20 can also be leaf springs, for example, and can be incorporated or integrated into the fastening means 18, for example, in the form of at least one flexible flange. In this case, the mounting device 10 is the same the fastening means and the spring-loaded means.

Moreover, the process and the mounting device 10 of the invention can also be applied to any heat-dissipating electrical or electronic component. It is also evident that the contact may be thermal or electrical. For example, one of the elements can serve as an electrode or as a potential plane for making contact with the non-active surface of a field effect transistor integrated circuit, for example of the MOS (Metal-Oxide Semiconductor) type. In the example illustrated, it would be sufficient for the nuts 23 to be connected to a potential plane, for example the ground, and for the nuts, the screws and the heat sink to form an electrical link with the non-active surface of the integrated circuit so as to establish a contact which is both thermal and electrical Therefore, the board 11 and the heat sink 12 may therefore more generally be replaced by other elements which sandwich a component by means of a mounting device 10 which exerts a contact force on the component.

In general, it may therefore be said that the subject of the invention is a process for mounting two elements 11, 12 which sandwich an electrical or electronic component 13 by means of a mounting device 10 which exerts a contact force Fc on the component, which mounting device exerts on the first of these two elements 12 a force F0 which is independent of the mounting of the two elements (FIG. 1) and which has a relationship to this contact force.

It has been shown that the relationship may be one of substantial equality, one which allows for a given thickness W of the component, or any other suitable relationship. It has also been shown that the force F0 exerted may be predetermined or may be any force whatsoever It is also worth noting that in the process described in reference to FIGS. 2a and 2b, the mounting device 10 exerts the contact force Fc substantially independently from the mounting force Ff of the mounting device on the second element 11.

One advantage of the invention can be attained by firmly mounting the mounting device 10 onto the board 11 which constitutes the second element in the example illustrated. The heat sink 12 is then securely fastened in the desired position on the board 11 and is not overly sensitive to vibrations, since the springs serve to lesson the vibrations.

Another advantage may also be obtained by rendering the mounting device relatively independent of the first element 12 so that the contact force Fc is uniformly distributed on the component 13. For example, it would suffice to enlarge the diameter of the holes 19 so that the heat sink 12 floats relative to the screws 18 and can therefore be more precisely adjusted to the contact surface of the component. The mounting device 10 could then be less sensitive to unevenness on the surface of the heat sink 12 and/or the board 11 and/or the component 13.

Therefore, a corollary subject of the invention is a device 10 for mounting two elements 11, 12 which sandwich an electrical or electronic component 13 and which exert a contact force Fc on the component by means of the first of the two elements 12, on which it exerts a force which is independent of the mounting of the two elements.

It has been shown that the mounting device may be any device and may be attached to the heat sink or to the board through means other than the holes 19 and 22. The independence of the force exerted by the mounting device from the mounting of the two elements may be obtained with means for coupling the mounting device with one of the elements, i.e. the heat sink 12 in the example illustrated. In the particular case which has been used as an example, in which the mounting device includes fastening means 18 coupled with spring-loaded means 20, the coupling means include first means for stopping 21 against this first element. It is obvious that the stopping suitable device which accomplishes this purpose 21 may be any means. For example, instead of the clips illustrated, the means for stopping could include a thin ring which is integral with the body of the screw and has a larger profile. In this case, passage through the holes 19 in the heat sink could be achieved by making the screw head removable for example by screwing it onto the body of the screw or by replacing the head of the screw with a washer or a clip. In the latter case, it is understood that each screw could be replaced by a non-threaded element. According to another variant, each stop 21 could be a collar formed by a section larger than the screw body beneath the stop. The stops 21 could also be adjustable in order to adjust the force F0 to a predetermined value. Although the force exerted by the spring-loaded means 20 could be any force whatsoever it can be adjusted to a predetermined value by adjusting the stops 21, for example as described in reference to FIG. 3. The stops could then be adjustable so that this adjustment could be made for example by replacing the clip with a nut of adjustable height.

It has been shown in reference to FIGS. 2a and 2b that the stops 21 make it possible to attach fastening means 18 to the heat sink 12 with a force which is independent of this contact force Fc. However, these figures clearly show that the stops provided for rendering the mounting force Ff of the device 10 on the board 11 independent from the contact force Fc could be different from the stops 21. For example, they could be other clips disposed, in a fixed or adjustable way, in a lower position, or even a collar which is integral with a part of the screw which has a larger profile, whose height could be chosen so that the upper collar assumes the function of the stops 21 relative to the heat sink 12. Although the mounting force Ff described is completely independent of the contact force Fc, these two forces could be linked to one another. For example, the mounting force Ff could be determined by a spring linked to the screwing of each screw, which also conditions the contact force Fc. An advantage of the invention is to be able to make use of this link to render these two forces Ff and Fc substantially independent for example by using a roughly conical washer, which assumes the function of the spring as a stop for determining the mounting force Ff.

Consequently, another subject of the invention is an element 11 or 12 equipped with the preceding device 10 for mounting this element to another element 12 or 11 and for exerting a contact force Fc on an electrical or electronic component 13 sandwiched between the two elements.

More particularly, referring to the example illustrated, another subject of the invention is a heat sink 12 for cooling an electrical or electronic component which includes a mounting device, which heat sink constitutes the first element in the mounting device described previously Another more particular object of the invention is a board for connecting at least one electrical or electronic component, which board constitutes the first element equipped with the mounting device 10 defined previously.

While the preferred embodiments of the instant invention have been illustrated and described herein, it will be apparent to those skilled in the art that various changes and modifications may be made without deviating from the inventive concepts and spirit of the invention, and it is intended by the appended claims to define all such modifications which fall within the true scope and spirit of the instant invention.

We claim:

1. An assembly comprising a heat sink (12) and a board (11), said heat sink and said board sandwiching an electrical or electronic component therebetween, said assembly further comprising pressure means (20) for causing said heat sink to exert a contact force (Fc) on the component, and coupling means (18, 21) passing through said heat sink and said board for coupling said pressure means with said heat sink, and for preloading a biasing force (4F0) on said heat sink prior to said heat sink being mounted onto said board, wherein said biasing force is related to said contact force.

2. The assembly according to claim 1, wherein said coupling means includes fastening means (18) coupled with said pressure means, and first stopping means (21) for stopping against said heat sink.

3. The assembly according to claim 2, wherein said fastening means includes second stopping means which enables the fastening means to be secured to the board with a mounting force which is substantially independent from said contact force.

4. An assembly comprising a first element (12) and a second element (11), said first and said second elements sandwiching an electrical or electronic component (13) therebetween, said assembly including pressure means (20) for causing said first element to exert a predetermined contact force (Fc) on the component and coupling means (18, 21) passing through said first and second elements for coupling said pressure means to said first element, said coupling means retaining said pressure means and said first element together in a manner such that said pressure means exerts a preloaded biasing force on said first element prior to said first element being mounted onto said second element, and wherein said biasing force is related to said predetermined contact force.

5. The assembly according to claim 4, wherein said coupling means includes fastening means (18) coupled with said pressure means, and first stopping means (21) for stopping against said first element.

6. The assembly according to claim 5, wherein said fastening means includes second stopping means which enables the fastening means to be secured to the second element with a mounting force which is substantially independent from said contact force.

7. An electronic component frame assembly comprising a first element and a second element sandwiching an electrical or electronic component therebetween, said assembly further including:

pressure means for effecting a predetermined contact force to be exerted by said first element on said component;

fastener means passing through said first and second elements for fastening said first element to said second element, said fastener means being operatively coupled to said first element by a coupling means for operatively coupling said first element to said fastener means and to said pressure means, said pressure means being disposed in a position whereby a biasing force is exerted between said fastener means and said first element prior to said first element being mounted onto said second element, wherein said biasing force is related to said predetermined contact force; and said second element having means for receiving said fastening means to mount said first element onto said second element.

8. An electronic component frame assembly comprising a heat sink and a board, said heat sink and said board, sandwiching an electrical or electronic component therebetween, said assembly further comprising:

pressure means for effecting a predetermined contact force to be exerted by said heat sink on said component;

fastener means passing through said heat sink and said board for fastening said heat sink to said board, said fastener means being operatively coupled to said heat sink by a coupling means for operatively coupling said heat sink to said fastener means and to said pressure means, said pressure means being disposed in a position whereby a biasing force is exerted between said fastener means and said heat sink prior to said heat sink being mounted onto said board, and wherein said biasing force is employed to govern said predetermined contact force; and said board having means for receiving said fastening means to mount said heat sink onto said board.

* * * * *

UNITED STATES PATENT AND TRADEMARK OFFICE
CERTIFICATE OF CORRECTION

PATENT NO. : 5,901,039
DATED : May 4, 1999
INVENTOR(S) : Gérard DEHAINE et al.

It is certified that error appears in the above-indentified patent and that said Letters Patent is hereby corrected as shown below:

Title page, insert -- item [30], Foreign Application Priority Data,

Dec. 29 1994     FR     France     94 15886 -- .

Signed and Sealed this

Twenty-third Day of November, 1999

Attest:

Q. TODD DICKINSON

*Attesting Officer*     *Acting Commissioner of Patents and Trademarks*